(12) United States Patent
Fangman et al.

(10) Patent No.: US 9,467,089 B2
(45) Date of Patent: Oct. 11, 2016

(54) SOLAR CONCENTRATOR CONFIGURATION WITH IMPROVED MANUFACTURABILITY AND EFFICIENCY

(71) Applicant: CEWA TECHNOLOGIES, INC., Wyomissing, PA (US)

(72) Inventors: John Stewart Fangman, Reading, PA (US); Michael E. Fangman, Reading, PA (US); John Matthew Fangman, Reading, PA (US); Sudhakar Neti, Hanover Township, PA (US); Arati Shah-Yukich, Bethlehem, PA (US)

(73) Assignee: CEWA TECHNOLOGIES INC., Wyomissing, PA (US)

( * ) Notice: Subject to any disclaimer, the term of this patent is extended or adjusted under 35 U.S.C. 154(b) by 263 days.

(21) Appl. No.: 14/190,946

(22) Filed: Feb. 26, 2014

(65) Prior Publication Data
US 2014/0174504 A1 Jun. 26, 2014

Related U.S. Application Data

(63) Continuation of application No. 12/841,266, filed on Jul. 22, 2010, now Pat. No. 8,680,391.

(60) Provisional application No. 61/228,440, filed on Jul. 24, 2009.

(51) Int. Cl.
*H01L 31/042* (2014.01)
*F24J 2/10* (2006.01)
(Continued)

(52) U.S. Cl.
CPC .............. *H02S 20/32* (2014.12); *F24J 2/1047* (2013.01); *F24J 2/1057* (2013.01); *F24J 2/12* (2013.01); *F24J 2/18* (2013.01); *F24J 2/38* (2013.01); *G01D 5/3473* (2013.01); *H01L 31/052* (2013.01); *H01L 31/056* (2014.12); *H01L 31/0547* (2014.12); *H02S 40/00* (2013.01); *H02S 40/44* (2014.12);
(Continued)

(58) Field of Classification Search
CPC .......... H02S 20/32; H02S 40/44; F24J 2/10; F24J 2/12; F24J 2/18; F24J 2002/1014; F24J 2002/1019
USPC ................. 136/243–265; 126/600, 684, 690; 250/200, 201.1, 203.4; 359/850–852
See application file for complete search history.

(56) References Cited

U.S. PATENT DOCUMENTS 3,267,617 A 8/1966 Volk
3,988,166 A 10/1976 Beam
(Continued)

OTHER PUBLICATIONS

STIC search results for U.S. Appl. No. 12/841,266 (Results cited in Notice of Allowance mailed on Nov. 4, 2013 issued in U.S. Appl. No. 12/841,266.
(Continued)

*Primary Examiner* — Allison Bourke
*Assistant Examiner* — Andrew Golden

(57) ABSTRACT

A solar concentrator comprises a pair of concentric reflectors having a spindle toroid geometry for focusing the collected solar radiation into a ring-shaped focal area, as opposed to the "point" or "line" focus of prior art configurations. In a preferred embodiment, each reflector is formed of a plurality of curved petals that are disposed in a contiguous, keystone arrangement that requires no additional fixturing to hold the petals in place. Such an arrangement reduces the weight, complexity and cost of the final solar concentrator structure.

21 Claims, 4 Drawing Sheets

(51) Int. Cl.
*G02B 5/10* (2006.01)
*F24J 2/12* (2006.01)
*F24J 2/18* (2006.01)
*H02S 40/44* (2014.01)
*H01L 31/054* (2014.01)
*H01L 31/056* (2014.01)
*H01L 31/052* (2014.01)
*G01D 5/347* (2006.01)
*H01L 31/02* (2006.01)
*F24J 2/38* (2014.01)

(52) U.S. Cl.
CPC .. *F24J 2002/1085* (2013.01); *F24J 2002/385* (2013.01); *H01L 31/02024* (2013.01); *Y02B 10/20* (2013.01); *Y02E 10/42* (2013.01); *Y02E 10/47* (2013.01); *Y02E 10/52* (2013.01)

(56) References Cited

U.S. PATENT DOCUMENTS

| | | |
|---|---|---|
| 4,148,299 A | 4/1979 | Sherman, Jr. |
| 4,161,942 A | 7/1979 | Monk |
| 4,240,406 A | 12/1980 | Hutchison |
| 4,348,798 A | 9/1982 | Hutchison |
| 4,611,575 A | 9/1986 | Powell |
| 4,678,292 A | 7/1987 | Myatani et al. |
| 4,919,527 A | 4/1990 | Saiylov et al. |
| 4,947,825 A | 8/1990 | Moriarty |
| 5,002,379 A | 3/1991 | Murtha |
| 5,882,434 A | 3/1999 | Horne |
| 5,934,271 A | 8/1999 | Kaneff |
| 6,528,716 B2 | 3/2003 | Collette et al. |
| 6,945,660 B2 | 9/2005 | Arcos Gomar et al. |
| 2004/0140000 A1 | 7/2004 | Cohen et al. |
| 2006/0124123 A1 | 6/2006 | Whelan |
| 2006/0225582 A1 | 10/2006 | Tasch et al. |
| 2007/0240705 A1 | 10/2007 | Papadopoulos |
| 2007/0256725 A1 | 11/2007 | Fork et al. |
| 2007/0256726 A1 | 11/2007 | Fork et al. |
| 2008/0037116 A1 | 2/2008 | Alasaarela et al. |
| 2008/0230049 A1 | 9/2008 | Dol |
| 2008/0314438 A1 | 12/2008 | Tran et al. |

OTHER PUBLICATIONS

U.S. Appl. No. 12/841,266, filed Jul. 22, 2010.

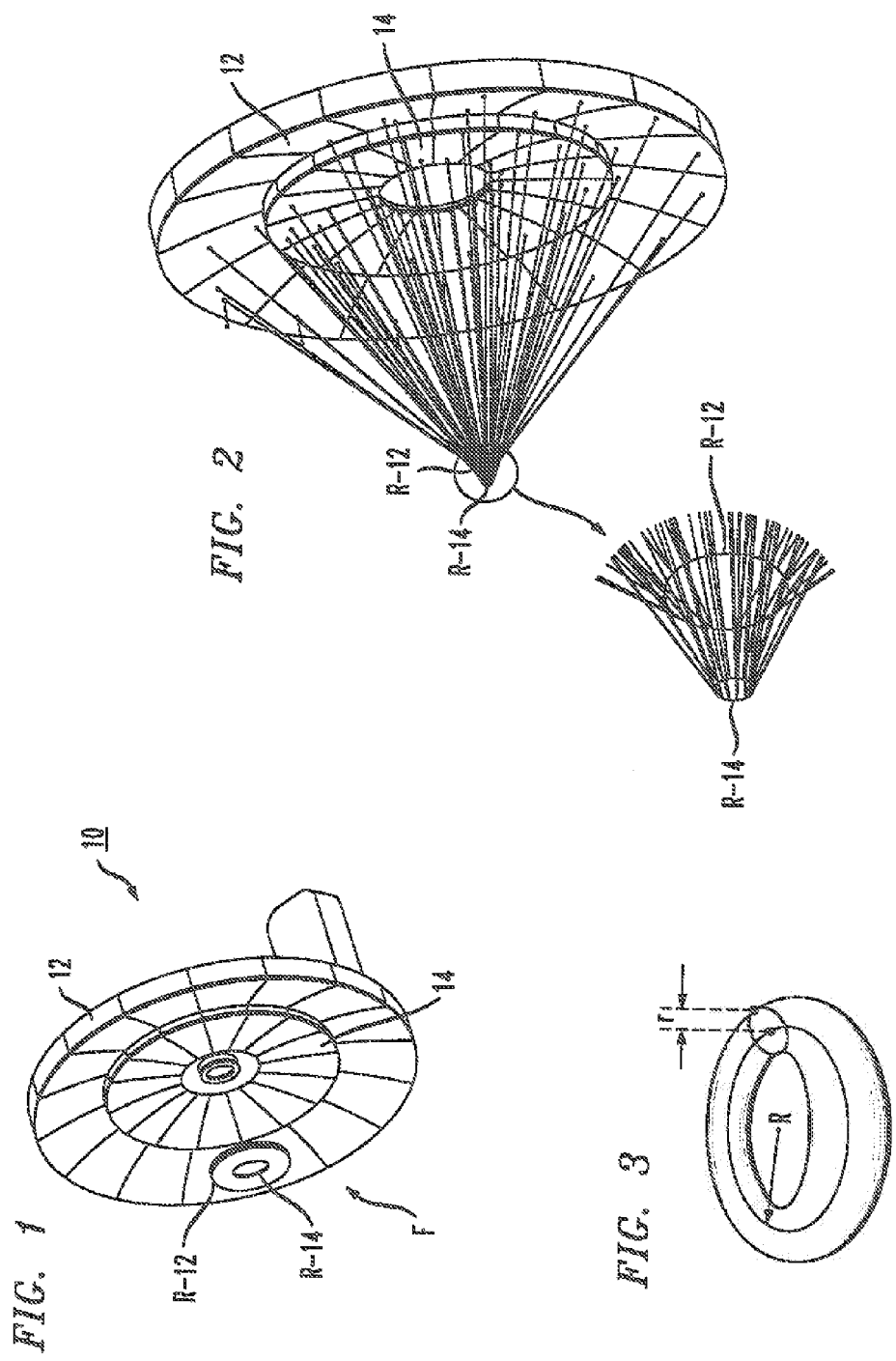

SOLAR CONCENTRATOR CONFIGURATION WITH IMPROVED MANUFACTURABILITY AND EFFICIENCY

CROSS-REFERENCE TO RELATED APPLICATION

This application is a continuation of and claims priority to U.S. patent application Ser. No. 12/841,266, filed Jul. 22, 2010, now pending, which claims the benefit of U.S. Provisional Application No. 61/228,440, filed Jul. 24, 2009, now expired, which is herein incorporated by reference.

TECHNICAL FIELD

The present invention relates to a solar concentrator particularly well-suited for low cost applications, with easy assembly and repair and, more particularly, to a solar concentrator comprising a pair of concentric reflectors having a spindle toroid geometry for focusing the collected solar radiation into a ring-shaped focal area, as opposed to the "point" or "line" focus of prior art configurations.

BACKGROUND OF THE INVENTION

The incident solar radiation at the surface of the earth has fairly low intensity, somewhat variable depending on the time of the day, season and location of the earth; roughly 800-1000 watts of thermal energy per square meter of area. For the solar industry to become commercially competitive in diverse global markets as compared to the costs of energy production from fossil industry (such as coal-generated energy), the key challenges for the solar industry are to harness the solar radiation at high efficiency and significantly low costs, and improve both the ease of global manufacturability of solar technologies and the ease of assembly and implementation by the conventional commercial sector for diverse applications.

There are primarily four categories of solar energy harnessing technologies. The first of which, denoted as passive solar devices, take the form of solar heaters and roof top solar panels with pipes running underneath that are simply heated from incident solar radiation; the heat transferring to the fluid or air passing through the passive solar devices. However, passive solar radiation intensity is generally too low to be directly useful for most applications that require heat at high temperatures and pressures (such as running HVAC, industrial process heat, turbines, etc.). Another category of solar technology takes of the form of flat panels of solar photovoltaic cells that contain semiconductor devices. These devices convert incident solar radiation directly into electricity; the electrical energy output is a direct function of the area of the PV cell array. Solar "concentrators" are considered as another category and are designed to reflect the incident solar radiation from a large area onto a smaller focal area in order to concentrate (collect) the solar radiation to generate large amounts of heat that can be transferred to a fluid circulating at the focal area (thus achieving higher temperature and pressure), suitable for various applications where heat of desired quality is needed, such as industrial process heat, HVAC heating and cooling, desalination, dehydration etc., or for steam production to drive turbines in order to generate electricity. Recently, a hybrid technology has been explored, where solar collectors are used in conjunction with a special type of PV cell; the solar concentration technology directs a high intensity solar radiation beam onto a specialized small number of photovoltaic cells (called concentrator PV cells) at the focal area of the collectors. Thus, concentrating solar collectors in conjunction with PV cells have an advantage over flat-panel collectors in that they utilize substantially smaller amounts of semiconductor material, while also being more efficient in generating electrical energy.

In any event, solar concentrator technologies are most widely useful whether the application needs heat or electricity or both. As compared to passive solar technologies or PV cell technologies, solar concentrators provide heat at low-costs and high efficiency.

One particular type of concentrating collector is known in the art as a parabolic trough collector. This type of collector uses an elongated reflective trough having a parabolic cross-section to concentrate the sun's radiation along a focal line extending through the focal points of the parabolic elements forming the trough. A conduit is typically positioned along this focal line, with a heat-transferring liquid circulating through the conduit. The liquid will be heated by the sun's energy as it moves through the conduit.

Alternatively, a solar concentrator may take the form of a parabolic point concentrator, using a plurality of curved mirrors arranged to form a parabolic dish that focuses the incoming solar radiation onto a single point. A Stirling engine or cavity receiver is typically placed at the focal point of the dish concentrator to capture the solar energy and convert it into heat (or mechanical) energy.

Yet another variation of solar concentrator technology is referred to as a "power tower" or "heliostat", where hundreds of individual parabolic point reflectors are arranged in a solar field and each reflector focuses its beam onto the top of a large central tower where the receiver is housed. The advantage of this configuration is that the heat collection from a large collection area of the field is centralized to minimize heat loss and cost of piping. However, the shadowing effects, large land requirements, and other considerations are some of the disadvantages of the power tower types of concentrator technologies.

Recently, a hybrid concentrator technology has been developed called a Concentrated Linear Fresnel Reflector (CLFR) where there is a hybrid of trough shape reflectors are arranged in a field with a central linear receiver. That is, instead of a small receiver area on the tower, the CLL uses a long receiving pipe that collects focal beams of an array of parabolic reflectors.

One problem with these and other types of conventional concentrating solar collectors is that they are expensive to fabricate and install. Additionally, the configurations are usually "application specific" in terms of being designed for the specific geographic conditions of a given site (i.e., a function of the local movements of the sun), or requiring highly planar field for fine mirror alignment, or requiring a large tract of land in a desert, etc.). Each implementation also has requirements for specific dimensions (in terms of their surface area, lengths, etc.), offering little flexibility to adapt to application-specific situation. Moreover, the solar collector optics are generally comprised of glass reflectors that must be painstakingly constructed and polished, require costly supporting structures, and thereafter require extensive and tedious installation.

Thus, a need remains in the art for an improved solar concentrator with efficient operation, while being relatively simple to install and maintain, and ubiquitous in how they are used (to produce heat, electricity, or both) and as few or as many as needed.

SUMMARY OF THE INVENTION

The needs remaining in the art are addressed by the present invention, which relates to a solar concentrator particularly well-suited for low cost applications, with easy assembly and repair and, more particularly, to a solar concentrator comprising a plurality of concentric reflectors having a spindle toroid geometry for focusing the collected solar radiation into ring-shaped focal areas, as opposed to the "point" or "line" focus of prior art configurations. In one embodiment discussed below, a pair of reflectors is shown. However, it is to be understood that the solar concentrator of the present invention may utilize any number of reflectors having the preferred spindle toroid geometry.

In accordance with the present invention, therefore, each reflector is formed to exhibit a spindle toroid geometry and thus focus the incoming solar radiation into a ring-like focal area Unlike the focal line or point focusing properties associated with the prior art trough and dish reflectors, the spindle toroid reflector creates a ring-like focal area, concentrating a larger amount of the incoming energy into a small region while not requiring the precise alignment between receiver and concentrator associated with the prior art dish ("point") concentrator.

In a preferred embodiment of the present invention, each reflector is formed of a plurality of curved petals that are disposed in a contiguous, keystone arrangement that requires minimal fixturing (e.g., epoxy) to hold the petals in place. Such an arrangement reduces the weight, complexity and cost of the final solar concentrator structure.

In a preferred arrangement of the above-described embodiment, each petal is of monocoque construction, where the outer "skin" of the petal also functions to provide the necessary rigidity to the petal and carries all of the applied load. Each petal may have a reflective outer surface or may be formed itself of a reflective material disposed across its outer surface. Materials such as aluminum or elastically-formed thin glass are suitable for this reflective surface.

The solar concentrator of the present invention may be configured in conjunction with a Cassegrain-type system, where a secondary reflector disposed along the optical axis redirects the concentrated solar radiation into a receiver positioned at another location. Alternatively, a receiver in the form of a concentrated solar thermal (CST) system or concentrated photo-voltaic (CPV) cell may be disposed at the ring-like focal area.

In yet another embodiment of the present invention, a dielectric filter may be disposed at the ring-like focal area and used to direct the wavelengths associated with thermal energy production into a thermal-based receiver, while directing the wavelengths associated with electrical energy production into, for example, a PV structure.

Other and further embodiments and aspects of the present invention will become apparent during the course of the following discussion and by reference to the accompanying drawings.

BRIEF DESCRIPTION OF THE DRAWINGS

Referring now to the drawings, where like numerals represent like parts in several views:

FIG. 1 is an isometric view of an exemplary solar concentrator 10 formed in accordance with the present invention;

FIG. 2 is a ray tracing diagram illustrating the concentration of the reflected solar radiation for the solar concentrator of FIG. 1;

FIG. 3 illustrates a standard torus configuration, useful for understanding the spindle toroid geometry of the inventive solar reflectors;

DETAILED DESCRIPTION

Figure 4:
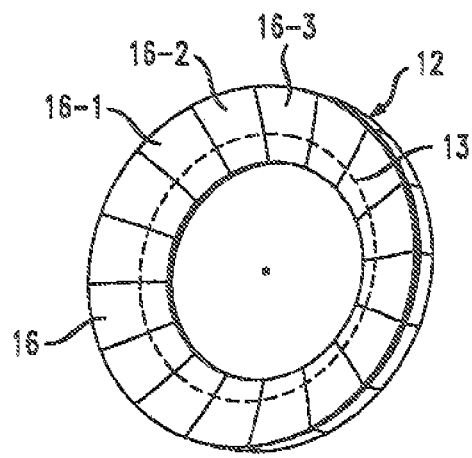
FIG. 4 is a front view of an exemplary outer reflector of the inventive solar concentrator, illustrating its keystone configuration.

FIG. 1 is an isometric view of an exemplary solar concentrator 10 formed in accordance with the present invention. Unlike prior art solar concentrator arrangements based on creating "point" or "line" concentration of the solar radiation, the spindle toroid geometry of the inventive concentrator functions to direct the reflected solar into ring-like regions at the focal area F of concentrator 10. As mentioned above, the ring-like focal area provides a greater concentration of energy than the "line" focus associated with the prior art trough collectors, without requiring the expensive alignments associated with the prior art "point" focus associated with the prior art dish collectors.

In particular, solar concentrator 10 is shown as comprising a pair of concentric reflectors including an outer reflector 12 and an inner reflector 14, where each reflector is formed of the spindle toroid geometry. As mentioned above, the use of a pair of reflectors is considered to be exemplary only, any suitable number of reflectors may be utilized to form a particular solar concentrator assembly.

Referring again to FIG, 1, the incoming solar energy reflected from outer reflector 12 will be concentrated into a ring R-12 at focal area F, as shown, with the solar energy reflected from inner reflector 14 concentrated into a somewhat smaller ring R-14 at the same focal area F. FIG. 2 is a ray tracing diagram illustrating the concentration of the reflected solar radiation into rings R-12 and R-14, also showing an enlargement of rings R-12 and R-14 for the sake of clarity. By forming outer reflector 12 and inner reflector 14 of the preferred spindle toroid curvature, each one will independently reflect and focus the incoming light rays into a concentric ring configuration by separately delivering reflected beams at different locations as desired.

A standard torus is shown as a "tube" in FIG. 3 and is defined by the following set of equations:

$$x(u,v)=(R+r\cos v)\cos v$$

$$y(u,v)=(R+r\cos v)\sin v$$

$$z(u,v)=r\sin v,$$

where u and v and within the interval $(0, 2\pi)$, R is the distance from the center of the tube to the center of the torus, and r is the radius of the tube. A spindle torus, as used herein in the formation of reflectors 12 and 14, is created when R<r, forming a "self-intersecting" surface. As a result, the cross section of each reflector 12, 14 in the x-z plane is defined by the following:

$$z=\pm[r^2-(x-R)^2 1]^{1/2}$$

With this definition of the structure of each of reflector 12 and 14, it can be shown that the focal area of each takes the form of a ring, which allows for a significant concentration of, in this case, solar radiation, into a well-defined, relatively small area for better heat distribution as compared to that prior art collectors with point focus. Rings R-12 and R-14 in FIGS. 1 and 2 illustrate this improvement in solar radiation concentration in accordance with the spindle toroid configuration of reflectors 12 and 14. Again, it is to be understood that the specific geometry of the focal area can be modified to suit different needs; that is, whether solar concentrator 10 is part of a CPV system, HVAC system, industrial heat generation, electricity, or the like. The ability to concentrate the solar radiation into such a relatively small area with improved heat distribution by ring focus, and without the need for the expensive, "tight tolerance" optics of prior art solar collectors is considered to be a significant advantage of the arrangement of the present invention.

It is another significant aspect of the present invention that each reflector 12, 14 in solar concentrator 10 comprises a plurality of separate reflecting "petals", held in place in a keystone arrangement such that the final reflector structure is self-supporting. No additional bracing or support structure is required; this is considered to be a significant advance over prior art concentrator designs that required an extensive support mechanism which added to the weight and cost (as well as construction complexities) of the overall concentrator. Indeed, by eliminating the need for a support structure, the final solar concentrator structure is considerably lighter, easier to assemble on-site, and easier to maneuver than conventional solar collectors.

Figure 5:
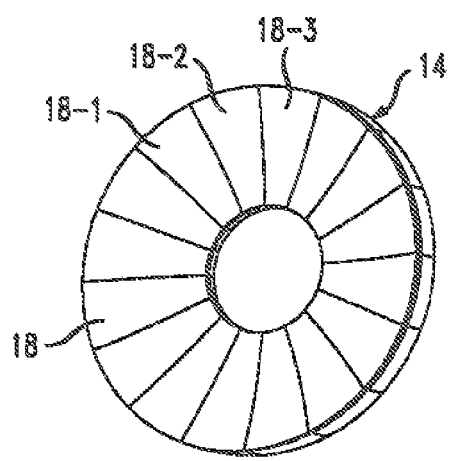
FIG. 5 is a front view of an exemplary inner reflector of the inventive solar concentrator, illustrating its keystone configuration.
Figure 6:
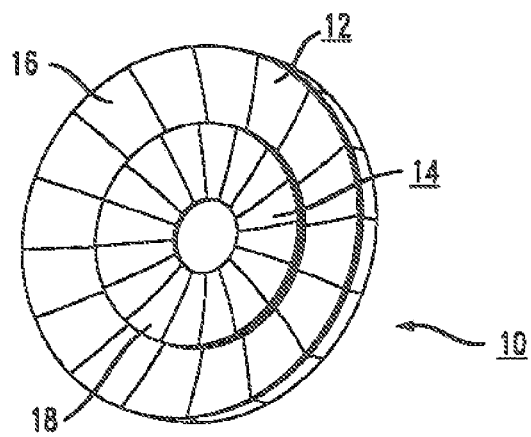
FIG. 6 is a from view of the concentric arrangement of the outer and inner reflectors, with the inner reflector disposed to overly the central region of the outer reflector.

FIGS. 4-6 particularly illustrate the keystone construction of solar concentrator 10, where FIG. 4 is an isometric view of outer reflector 12. FIG. 5 is an isometric view of inner reflector 14, and FIG. 6 shows the concentric arrangement of inner reflector 14 disposed to overly outer reflector 12. As noted above, each reflector will separately concentrate the impinging radiation into a ring-like focal area (see FIGS. 1 and 6). FIG. 6 in particular illustrates the concentric arrangement of solar concentrator 10, with inner reflector 14 affixed to overly the central area 13 of outer reflector 12 (central area 13 is indicated by the dotted line in FIG. 4).

FIG. 4 clearly illustrates the exemplary keystone configuration of outer reflector 12, where outer reflector 12 is shown as comprising a plurality of separate reflecting petals 16. A set of reflecting petals 16-1, 16-2 and 16-3 of reflector 12 is specifically referenced and shown as being disposed in a contiguous relationship, with the complete plurality of petals 16 disposed in a circular arrangement in the self-supporting keystone configuration. The exemplary embodiment of outer reflector 12 shown in FIG. 4 is formed of sixteen separate petals 16 and may be epoxied together, as discussed below, to form outer reflector 12. In one experimental design, a reflector of this geometry was shown to exhibit a clear aperture of 28.26 m2.

A similar keystone configuration of inner reflector 14 is shown in FIG. 5, where reflector 14 is shown as comprising a plurality of reflecting petals 18. A set of reflecting petals 18-1, 18-2 and 18-3 of inner reflector 14 is specifically illustrated in FIG. 5. As with outer reflector 12, a set of sixteen individual petals 18 is used to form this particular embodiment, epoxied together along their sides, to form the final arrangement as shown. A reflector of this geometry was found to exhibit a clear aperture of 14.13 m².

Figure 7:
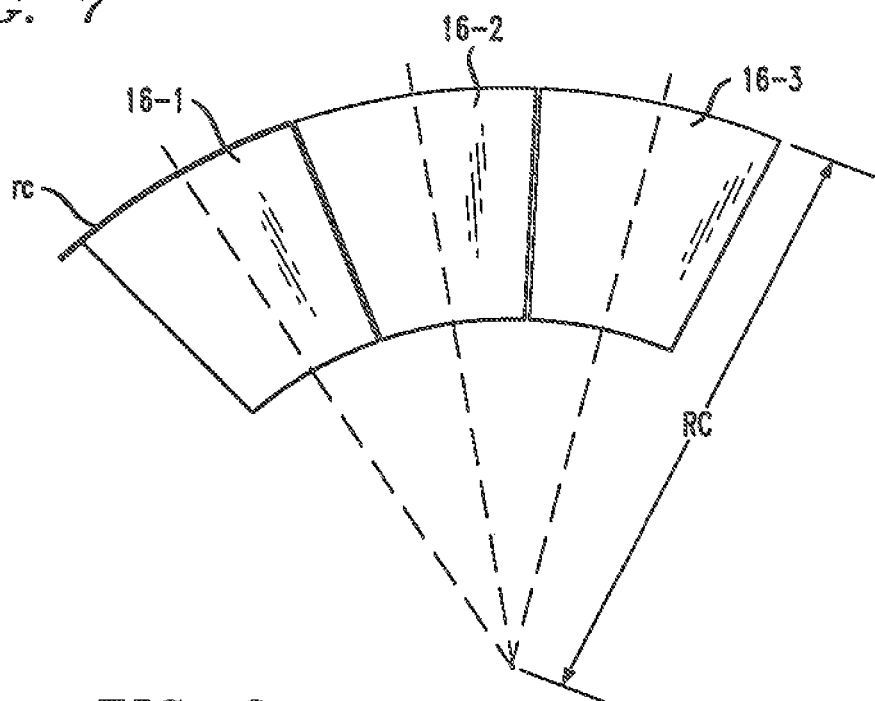
FIG. 7 illustrates the arrangement of a set of three separate petals from the outer reflector and their placement in creating the keystone configuration.

As noted above, the keystone configuration of each reflector in the solar concentrator of the present invention allows for adjacent petals to keep one another in place without additional fixturing. FIG. 7 shows the set of three petals 16-1, 16-2 and 16-3, as they are begun to be placed side-by-side along a radius of curvature RC for outer reflector 12, radius RC dictated by the curvature of the individual petals 16. An exemplary embodiment of outer reflector 12 may exhibit a curvature on the order of 10.725, while inner reflector 14 may have a slightly reduced curvature, on the order of 10.0. There is also presumed to be a unique relationship between the curvatures for outer and inner reflectors 12, 14 that allows for changes in size and shape of solar concentrator 10, as desired for various applications, while maintaining the optimal efficiency of light concentration (as well as directing desired wavelengths onto a receiver—which may comprise a number of PV cells). As stated above, the ability to form solar concentrator 10 without other support structure significantly reduces the cost, weight and complexity of the final solar concentrator system.

In accordance with another aspect of the present invention, each reflecting petal 16 and 18 comprises a monocoque construction, where a reflecting surface 20 (i.e., the "skin" of the petal) bears the majority of torsional and bending stresses. Monocoque construction, which has previously been used in the manufacture of automobiles and airplanes, reduces weight and cost while improving the strength by including the skin as a structural member. In accordance with the present invention, monocoque construction improves the ability of the concentrator to withstand stresses induced by the environment (wind loading).

Figure 8:
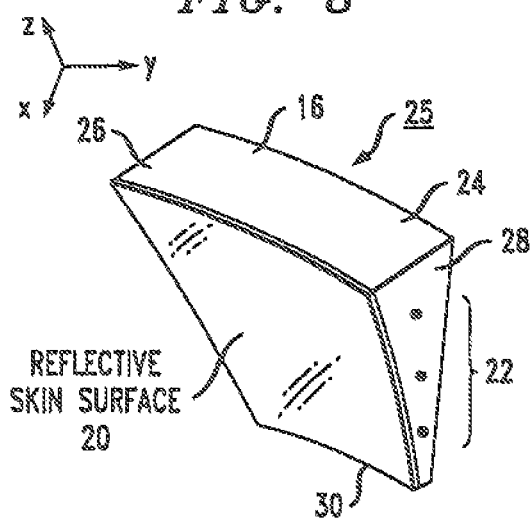
FIG. 8 is an isometric view of a single petal from a reflector, showing its preferred monocoque construction.

FIG. 8 is an isometric view of an exemplary monocoque-constructed petal 16 from outer reflector 12, where elements 22 indicate exemplary locations where epoxy (or other suitable fixing material, including bolts or mechanical fixtures) may be disposed to allow for the plurality of petals 16 to be joined together to form outer reflector 12 without the use of any other mechanical support (i.e., the "keystone" configuration discussed above in association with FIGS. 4-7). By affixing reflective skin surface 20 to an underlying support structure 25, the stresses experienced by an individual petal 16 are uniformly disposed across the entire surface of skin 20, allowing for the skin itself to be the load-bearing portion of the petal—the monocoque type of construction.

Figure 9:
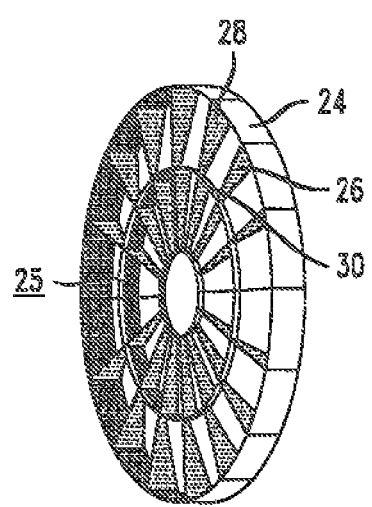
FIG. 9 is a rear view o supporting structure for the solar concentrator of the present invention.

Support structure 25 of each petal 16 or 18 is preferably formed of aluminum (or other suitable lightweight material) and, as shown in FIG. 8, comprises a top brace 24, a pair of opposing sidewalls 26, 28 and a lower brace 30. FIG. 9—a rear view of solar concentrator 10—clearly illustrates each petal support structure 25 for the pluralities of individual petals 16 and 18.

In accordance with the present invention, mirror surface skin 20 is formed of a reflective material, preferably a material that is lightweight and relatively easy to replace when damaged or aged. Material choices for skin 20 include, but are not limited to, a passivated aluminum (or a layer of passivated aluminum disposed on the surface of another material), a highly reflective dielectric material, a polymer, an ultra-thin glass (e.g., 50 microns or less), or the like. Various alloys and/or surface finishes may be used to provide the desired degree of reflectivity on the skin for the solar concentrator of the present invention.

It is an advantage of the sectionalized structure of each reflector forming the inventive solar concentrator that if skin surface 20 of a single petal is somehow damaged, a new sheet of appropriately-formed reflective material may simply be affixed to the surface of that petal. There is no need to dismantle the entire concentrator or remove the entire petal to solve the problem, as would be required for prior art arrangements.

Further, the use of aluminum for the light-weight monocoque construction of reflective skin surface 20 provides a significant advantage over the glass mirrors used in the conventional concentrators. In the conventional concentrators that use glass mirrors (which comprise of reflective surface coating such as silver nitrate and a glass cover to protect the reflective surface), the light beam suffers lcisses upon entering the protective glass as an incident beam and then upon exiting the glass as a reflected beam. By not requiring a glass cover, the present invention eliminates such loss of light and offers higher efficiency.

In accordance with the operation of the inventive solar concentrator, the concentric rings of concentrated solar radiation created at focal areas R-12 and R-14 (on the order of for example, 40 or more suns) is thereafter utilized by a suitable receiver (such as a photovolatic (PV) device and/or a thermal device) to transform the solar radiation into electricity and/or heat. The specifics of the receiver design will be determined so as to best match the desired energy flux distribution across the focal area (i.e., the "rings"). As mentioned above, the ring-shaped beam offers larger surface area for heat transfer onto the receiver than the prior art "point-shaped" beam, it is considered that the ability to adaptively configure the sensitivity of the receiver to match the distribution of the energy flux will even more so improve the efficiency and economy of the inventive solar concentrator over those available in the prior art.

One particular system for capturing and utilizing the concentrated solar radiation requires the use of an additional reflective surface to redirect the focused radiation (or at least a portion thereof) into an associated receiver. One advantage of using secondary reflection is that the receiver that may be more advantageously situated at a location (second focal region) other than initial focal area denoted by R-12 and R-14 (the first focal regions). This is useful because typically thermal or engine type of receivers are fairly heavy and therefore it is considered more practical to place this type of a receiver at the base. The used of a second focal region also allows for the concentrator assembly itself to be quickly and easily removed or repaired, without having to first disassemble a receiver component.

A number of different kinds of secondary mirrors geometry and surfaces such as glass, aluminum, dielectric) may be used. It is a significant additional aspect of the present invention to utilize a secondary mirror that consists of Cassegrain reflective surface. A Cassegrain mirror can be fabricated to allow 'application-specific' beam configuration to be reflected onto the receiver, typically located at the base of the concentrator system.

Figure 10:
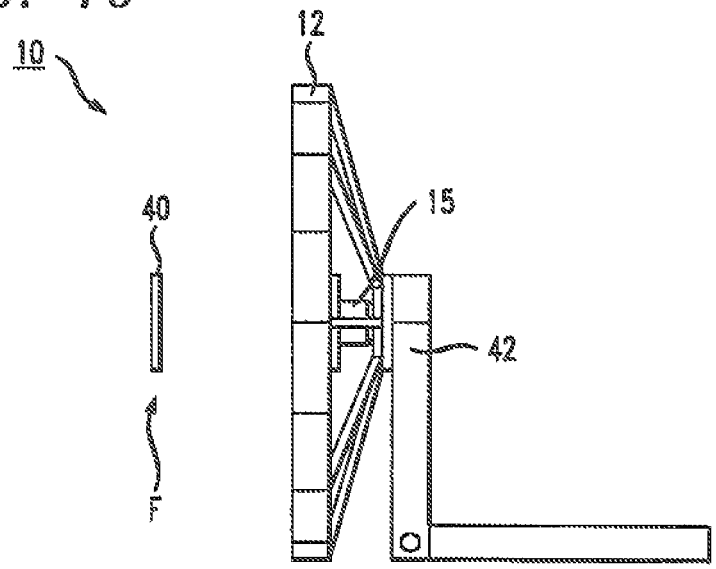
FIG. 10 is a side view of a Cassegrain type solar collection system using the solar concentrator of the present invention.

FIG. 10 is a side view of a solar collection system based on solar concentrator 10, showing the use of an additional reflective surface along the optical axis where the incoming rays will be concentrated in their ring-like patterns. In particular, a secondary reflector 40 is disposed at this location and used to redirect the concentrated radiation into a receiver that may be located at a second focal region (for example, in the center area 14 of inner reflector 14).

Figure 11:
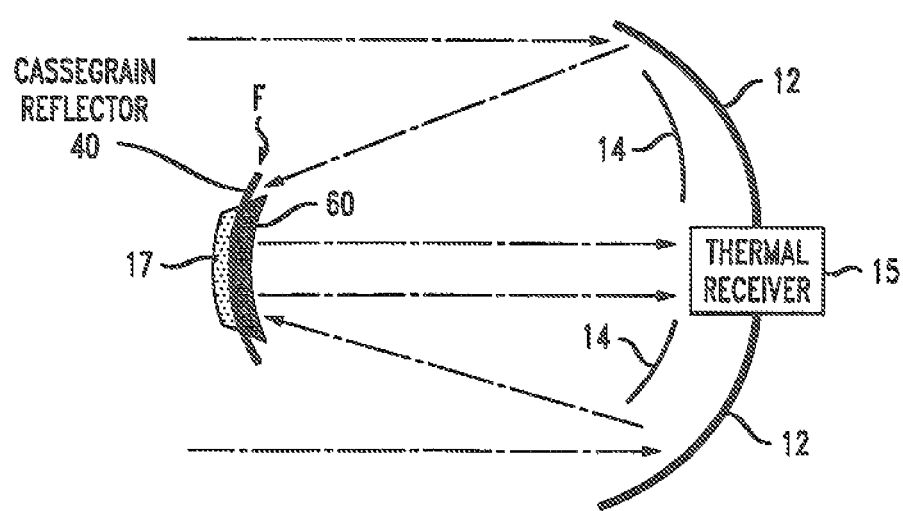
FIG. 11 is a top view of the system of FIG. 10.

FIG. 11 is a "top view" of the arrangement of FIG. 10. This view clearly shows the curvatures and relationship between secondary reflector 40 and the pair of spindle toroid reflectors 12 and 14 forming solar concentrator 10. Secondary reflector 40 is shown as redirecting the incoming, focused and concentrated radiation into a receiver 15 located at (for example) the center of inner reflector 14.

In addition to allowing for "application-specific" beam shaping, this Cassegrain-type arrangement of the present invention is particularly well-suited for situations where it is desired to extract multiple types of energy from the solar radiation, as described above. Indeed, it is possible, in accordance with one aspect of the present invention, to create both thermal and electrical outputs by directing the wavelengths (and frequencies) associated with the creation of electric energy into a PV cell array affixed at the secondary reflector, and directing the energy at the remaining wavelengths into a Stirling engine or other type of thermal receiver. That is, by incorporating a specific type of "notch" wavelength (frequency) filter at the focal area F, the different groupings of wavelengths may be directed into the proper receivers.

FIG. 11 shows secondary reflector 40 as being formed to include a "notch type" dielectric filter 60 disposed over the surface thereof. Dielectric filter 60 is fabricated to pass only the wavelengths associated with electrical energy creation, reflecting all other wavelengths associated toward receiver 15 (which is therefore configured as a thermal device). The wavelengths associated with the creation of electrical energy (e.g, 800-1200 nm) will pass through dielectric filter 16 and impinge a PV cell array 17 disposed behind secondary reflector 40. Thus, by covering the underlying surface of reflector 40 with PV cells 17, the wavelengths passing through filter 40 can be efficiently used to create electrical energy.

By virtue of incorporating both types of receivers in the system, very little remaining solar energy will need to be eliminated. Various types of receivers may be arranged and designed to use in association with this and other embodiments of the present invention.

While the invention has been described with regard to the preferred embodiments, it is to be understood by those skilled in the art that the invention is not limited thereof, and that changes and modifications may be made thereto without departing from the spirit and scope of the present invention as defined by the following claims.

What is claimed is:

1. A solar concentrator, comprising:
   a spindle toroid-geometry outer solar reflector, comprising:
      a first circular center region having a first radius R1 and a first focal length L1;
   a spindle toroid-geometry inner solar reflector overlying the circular center region of the outer solar reflector, comprising:
      a second circular center region having a second radius R2<R1 and a second focal length L2;
   a focal plane solar energy receiving device, comprising:
      an outer receiving ring at a common focal plane, and having a first ring radius r1, that receives solar energy from the outer solar reflector, and
      an inner receiving ring at the common focal plane, and having a second ring radius r2 that receives solar energy from the inner solar reflector.

2. The solar concentrator of claim 1, wherein:
   the inner solar reflector comprises a center area; and
   the focal plane solar energy receiving device comprises a secondary solar reflector, the solar concentrator further comprising:

a receiver, positioned at the center area that receives focused and concentrated radiation from the secondary solar reflector.

3. The solar concentrator of claim 2, wherein the focal lengths L1 and L2 are equal.

4. The solar concentrator of claim 3, wherein the focal plane solar energy receiving device is positioned at the equal first focal length L1 and second focal length L2, and wherein r1=r2.

5. The solar concentrator of claim 3, wherein the focal plane energy receiving device is positioned at a distance away from the equal first focal length L1 and second focal length L2, and wherein r1>r2.

6. The solar concentrator of claim 3, wherein the focal plane energy receiving device is positioned at a distance away from the equal first focal length L1 and second focal length L2, and wherein r1<r2.

7. The solar concentrator of claim 2, wherein the receiver comprises a thermal engine.

8. The solar concentrator of claim 1, wherein the focal plane solar energy receiving device further comprises:
a configurable array of energy receivers that extract multiple types of energy from the received solar energy.

9. A solar energy system, comprising
a solar concentrator including a plurality of concentric solar reflectors having a common optical axis, comprising:
an outer solar reflector having a center region and a first spindle toroid geometry;
an inner solar reflector overlying the center region of the at least the outer solar reflector and a second spindle toroid geometry;
a configurable primary solar energy collection region comprising a primary receiver positionable along the common optical axis, wherein changing a position of the primary receiver along the common optical axis changes a solar radiation collection area of the primary receiver.

10. The solar energy system of claim 9, wherein the primary receiver converts reflected solar radiation at the primary solar energy collection region into electrical energy, thermal energy, or both.

11. The solar energy system of claim 9, wherein the solar concentrator further comprises:
a secondary solar energy collection region; and
a secondary reflector, disposed at the primary region, that redirects at least a portion of the reflected solar radiation to the secondary solar energy collection region.

12. The solar energy system of claim 11, wherein the secondary reflector comprises a Cassegrain reflector.

13. The solar energy system of claim 11, wherein the secondary reflector comprises a wavelength selective device for directing predetermined wavelengths of the reflected solar radiation associated with electrical energy into a photovoltaic cell array and directing remaining wavelengths of the reflected solar radiation into a thermal energy receiver.

14. The solar energy collection system of claim 13, wherein:
the photovoltaic cell array is disposed at the primary solar energy collection region; and
the thermal energy receiver is disposed at the secondary solar energy collection region.

15. A solar concentrator, comprising:
a spindle toroid-geometry outer solar reflector, comprising:
a first circular center region having a first radius R1 and a first focal length L1;
a spindle toroid-geometry inner solar reflector overlying the circular center region of the outer solar reflector, comprising:
a second circular center region having a second radius R2<R1 and a second focal length L2;
a focal plane solar energy receiving device, comprising:
a disc-shaped receiver defined by an outer receiving ring having a first ring radius r1 and an inner receiving ring having a second ring radius r2 that receives solar energy from the outer solar reflector and the inner solar reflector.

16. The solar concentrator of claim 15, wherein L1<L2, and wherein the disc-shaped receiver is positioned between L1 and L2 and is defined by r1>r2.

17. The solar concentrator of claim 15, wherein L1=L2, and wherein the disc-shaped receiver is positioned at L1=L2.

18. The solar concentrator of claim 15, wherein the inner and outer reflectors each comprise a plurality of individual petals, each individual petal comprising a standalone monocoque structure.

19. The solar concentrator of claim 18, wherein the standalone monocoque structure comprises a skin surface with integral braces and sidewalls that absorbs all torsional and bending stresses in the standalone monocoque structure.

20. The solar reflector of claim 19, wherein the skin surface comprises a surface reflector.

21. The solar reflector of claim 19, further comprising a reflective surface applied over skin surface.

* * * * *